United States Patent [19]

Mase et al.

[11] Patent Number: 5,055,906
[45] Date of Patent: Oct. 8, 1991

[54] SEMICONDUCTOR DEVICE HAVING A COMPOSITE INSULATING INTERLAYER

[75] Inventors: Yasukazu Mase, Tokyo; Masahiro Abe; Tomie Yamamoto, both of Yokohama, all of Japan

[73] Assignee: Kabushiki Kaisha Toshiba, Kawasaki, Japan

[21] Appl. No.: 653,481

[22] Filed: Feb. 12, 1991

Related U.S. Application Data

[63] Continuation of Ser. No. 559,496, Jul. 26, 1990, abandoned, which is a continuation of Ser. No. 277,111, Nov. 29, 1988, abandoned.

[30] Foreign Application Priority Data

Nov. 30, 1987 [JP] Japan .................................. 62-302604

[51] Int. Cl.⁵ .............................................. H01L 29/34
[52] U.S. Cl. ............................................ 357/54; 357/51; 357/52
[58] Field of Search ............... 357/54, 71, 51, 52, 357/8

[56] References Cited

U.S. PATENT DOCUMENTS 4,523,372  6/1985  Balda et al. ........................... 357/54
4,613,888  9/1986  Mase et al. .
4,618,878  10/1986  Aoyama et al. ...................... 357/54

FOREIGN PATENT DOCUMENTS 0154419  9/1985  European Pat. Off. .
52-40987  3/1977  Japan .................................... 357/51
63-70567  3/1988  Japan .................................... 357/8

Primary Examiner—Andrew J. James
Assistant Examiner—Courtney A. Bowers
Attorney, Agent, or Firm—Finnegan, Henderson, Farabow, Garrett and Dunner

[57] ABSTRACT

A semiconductor device has a first interconnection pattern formed on a semiconductor substrate, and a second interconnection pattern located in and over a through hole formed at a composite insulating layer structure. The composite insulating layer structure is constituted by a first inorganic insulating film and an organic insulating film. At a peripheral region of the second interconnection pattern, the organic insulating film is partially eliminated to form an eliminated portion. The semiconductor device also has a second inorganic insulating film which is formed over the organic insulating film and is directly formed on the first inorganic insulating film, via the eliminated portion.

19 Claims, 5 Drawing Sheets

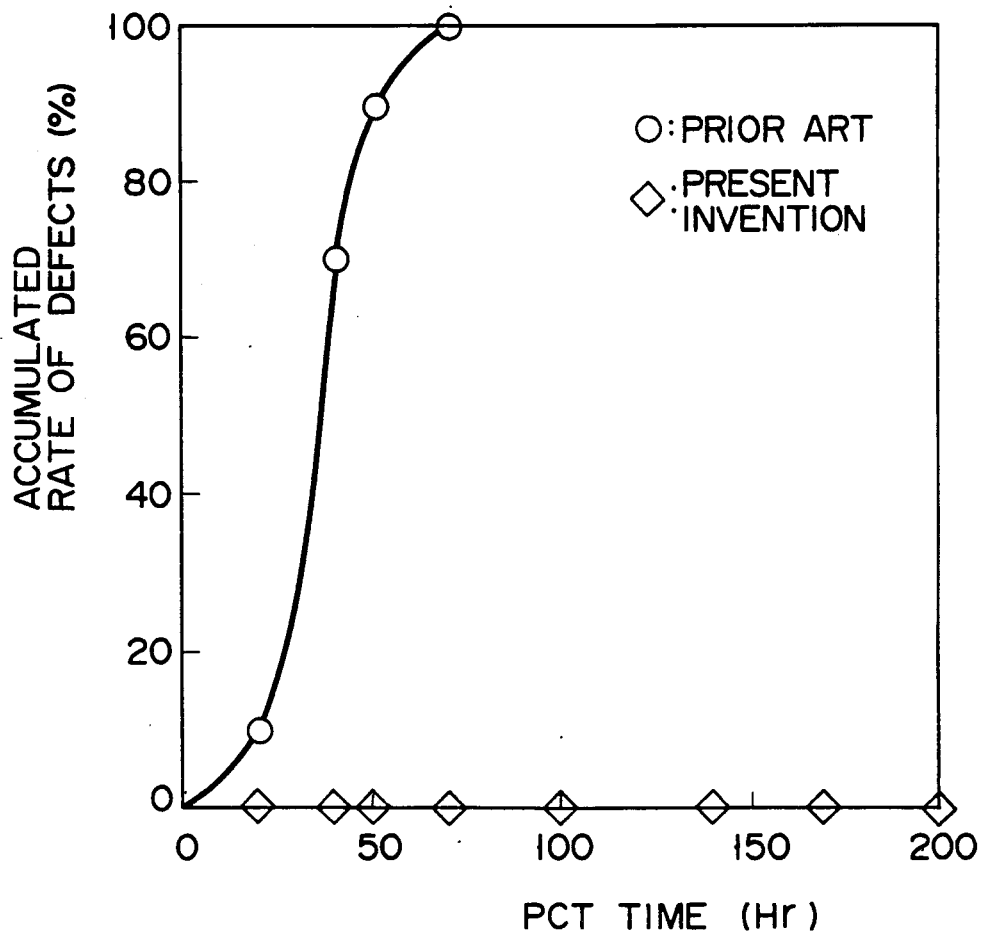
F I G. 3

5,055,906

SEMICONDUCTOR DEVICE HAVING A COMPOSITE INSULATING INTERLAYER

This application is a continuation of now abandoned application Ser. No. 07/559,486, filed July 26, 1990, which in turn is a continuation of abandoned application Ser. No. 07/277,111, filed Nov. 29, 1988, both now abandoned.

BACKGROUND OF THE INVENTION

1. Field of the Invention

The present invention relates to a semiconductor device having a multi-layered interconnection structure as well as a method for manufacturing the same, which is employed to form, over a semiconductor structure, a passivation film or a inorganic insulating interlayer of a composite inorganic/organic insulating structure having a composite inorganic, organic insulating interlayer.

2. Description of the Related Art

A conventional insulating interlayer structure will be explained below in connection with the process of forming an inorganic insulating film as a passivation film over a composite organic/inorganic insulating layer structure, by referring to FIG. 2.

First, 1.0 μm-thick plasma SiN film 13 (hereinafter referred to as a P-SiN) is deposited by a plasma CVD method on first interconnection layer 12 (1.0 μm-thick Al-Si layer) of a predetermined pattern formed on a thermal SiO$_2$-carried semiconductor substrate and then a through-hole A of a predetermined pattern is formed in the surface portion of the resultant structure by virtue of an ordinary photolithography and RIE (reactive ion etching) methods. A second through-hole of a predetermined pattern is formed by virtue of the ordinary photolithography and RIE methods on the structure subsequent to the coating of polyimide resin 14 and a predetermined heat treatment. Then second interconnection layer 15 (Al-Si 10 μm-thick) of a predetermined pattern is formed by the ordinary sputtering, photolithography and RIE methods. After a sintering step, 1.0 μm-thick P-SiN layer 16 is formed as a passivation film and pad opening 18 is formed by the ordinary photolithography and CDE (chemical dry etching) methods. After eliminating the photo-resist, a semiconductor device is completed which has a conventional multi-layered interconnection structure-see FIG. 2(b) FIG. 2(c) is a plan view where 17 denotes a dicing line and 19 shows cracks in inorganic insulating film 16 for passivation.

The composite interlayer of organic insulating film 14 and inorganic insulating film 13 has the advantages of being easier-to-handle in process, less in an electrical variation, higher in breakdown voltage and lower in cost. On the other hand, inorganic passivation film 16 is excellent in the resistance to humidity, as well as in the mechanical strength, as well known in the art. For this reason, a greater number of semiconductor devices have been manufactured which adopt a combination of the composite interlayer and inorganic passivation film When, after the assembly of the conventional combination type semiconductor structure, it is incorporated into an associated circuit board, a thermal shock test is conducted at which time a sample is quickly heated at 280° for 30 seconds, followed by a PCT step at 2.5 atmospheres at 127° C. for 20 hours. It has been found that 10% of samples tested are bad in a corrosion mode. In this connection reference is invited to FIG. 3. Here, PCT is a forced humidity-resistance test using pressure and temperature. By the term "corrosion" is meant the corrosion of an interconnection layer due to, for example, water.

Corrosion occurs all at pad site 18. This is due to a stress responsible for the inorganic passivation film, per se, at the pad site and to a stress responsible for the mold resin, as set out below. That is, inorganic passivation film 16 is formed on organic insulating film 14 and, upon the application of stress thereto, readily moved in the direction of a force applied. Since pad site 18 at the boundary of a pattern-free field area is moved by such a force to a greater extent, greater deformation occurs at the metal area of pad site 18 and cracks 19 occur at inorganic passivation film 16 with which the pad site is covered.

SUMMARY OF THE INVENTION

It is accordingly the object of the present invention to provide a semiconductor device of high reliability which has various advantages as obtained in a conventional composite insulating interlayer and can prevent the occurrence of cracks resulting from stress caused by thermal shock.

To achieve the above object a semiconductor device has a first interconnection pattern formed on an insulating film overlaying a semiconductor substrate, and a second interconnection pattern located in and over a through hole formed at a composite insulating layer structure. The composite insulating layer structure is constituted by a first inorganic insulating film and an organic insulating film. At a peripheral region of the second interconnection pattern, the organic insulating film is partially eliminated to form an eliminated portion. The semiconductor device also has a second inorganic insulating film which is formed over the organic insulating film and is directly formed on the first inorganic insulating film, via the eliminated portion. These inorganic insulating films are formed in direct contact with each other at a location corresponding to the eliminated portion of the organic insulating film. It is, therefore, possible to obtain a semiconductor device in a simpler manufacturing process, which has various advantages as obtained from a semiconductor device of a conventional multi-layered interconnection structure and provides an enhanced reliability and enhanced resistance to stress caused by heat shock.

BRIEF DESCRIPTION OF THE DRAWINGS

FIG. 3 is a graph showing a relation of a PCT to an accumulated rate of defects (%);

DETAILED DESCRIPTION OF THE PREFERRED EMBODIMENT

Figure 1A:
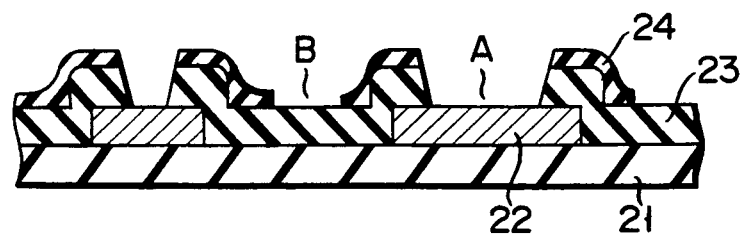
FIGS. 1(a), 1(b), and 1(c) are views showing a practical semiconductor device according to an embodiment of the present invention.

The embodiment of the present invention will be explained below with reference to FIG. 1.

Al-Si interconnection layer 22 was formed as first layer of a predetermined pattern on thermal $SiO_2$ film formed semiconductor substrate 21 by virtue of an ordinary sputter, photolithography and RIE methods. Then 1.0 μm-thick P-SiN film 23 was deposited by a plasma CVD method on the resultant structure and a given through-hole A was formed in P-SiN film 23 by the photolithography and RIE methods. Subsequent to removing a photoresist for the formation of the through-hole, coating a polyimide resin and heat-treating the resultant structure at 100° for 30 minutes and 250° for 60 minutes, a through-hole was formed by the ordinary photolithography and O2 RIE method such that it merges with the through-hole A in the P-SiN film and, at the same time, the polyimide was eliminated (indicated by B in FIG. 1), over a width of 20 μm, at a portion 15 μm from an area at which second interconnection pattern was formed inside a broader field area to provide 0.5 μm-thick polyimide film 24. After removing the photoresist for the formation of an opening, Al-Si interconnection layer 25 of a predetermined pattern was formed as a second interconnection layer on the resultant structure by virtue of the ordinary sputtering and photolithography methods. Then 1.0 μm-thick P-SiN film 26 was formed as a passivation film on the resultant structure by virtue of a plasma CVD method and a predetermined pad opening C was formed on the semiconductor structure by the ordinary photolithography and CDE methods (see FIG. 1(b)). FIG. 1(c) is a plan view where 27 and 28 represent a dicing line and bonding pad site, respectively.

Although, in the embodiment of the present invention, 0.5 μm-thick polyimide film and 1.0 μm-thick P-SiN film have been explained as being as the organic insulating film and inorganic insulating film, respectively, these films may be formed with a proper choice of their materials, their combination and their film thickness.

The dimension of the eliminated portion of the polyimide film around the second interconnection pattern, if having a crack prevention effect, may be properly selected.

The aforementioned embodiment of the present invention has various advantages of the multi-interconnection structure of a conventional composite insulating interlayer, that is, the advantages of being easier-to-handle in process high a breakdown voltage, less in electrical variation, higher in the resistance to humidity, lower in cost and, for the reason set forth below, higher in reliability (see FIG. 3). Since the inorganic insulating film underlying the organic insulating film and inorganic insulating film overlaying a metal interconnection layer formed on the organic insulating film are formed in direct contact with each other at the aforementioned eliminated portion of the organic insulating film around the second interconnection pattern, the inorganic passivation film per se, even if being subject to a force resulting from the stress of the molding resin for instance, is not moved in the direction of that force. As a result, there occurs almost no deformation at the metal interconnection layer portion, such as the pad site inside the broader filed area, and, furthermore, neither cracks nor corrosion is developed at the passivation film (inorganic insulating film). In addition, no corrosion occurs in the second interconnection layer. No extra process is necessary because it is possible to perform the removal of the organic insulating layer portion and the simultaneous formation of a through-hole.

Figure 1B:
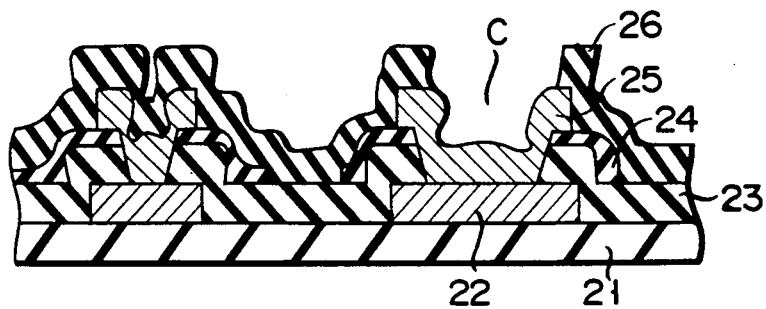
Figure 1C:
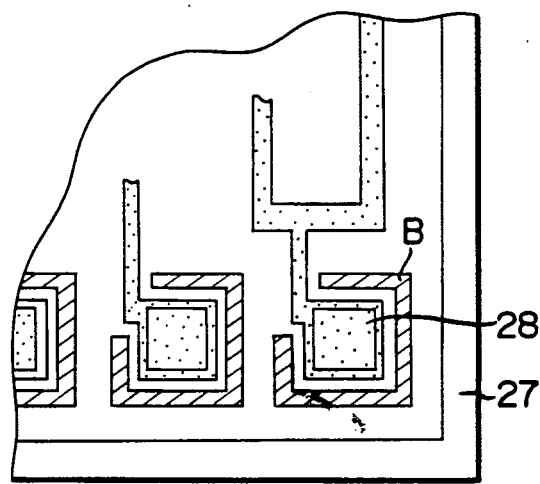
Figure 2A:
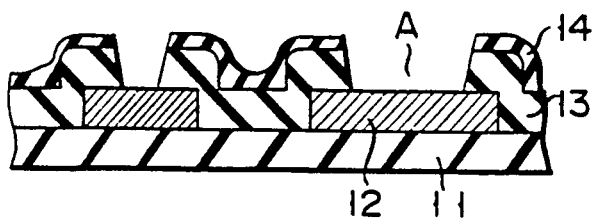
FIGS. 2(a), 2(b) and 2(c) are views showing a conventional semiconductor device.
Figure 2B:
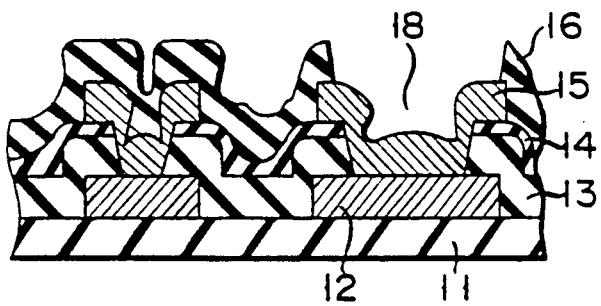
Figure 2C:
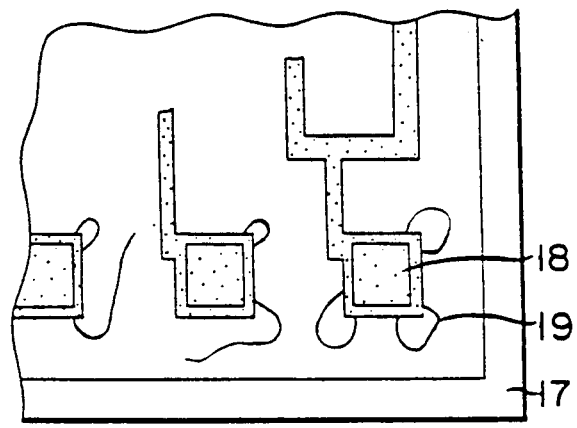
Figure 4:
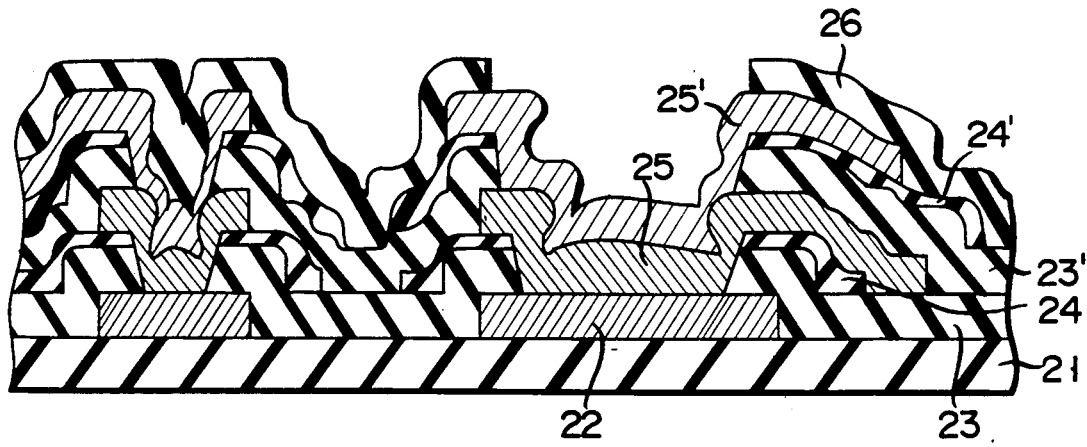
FIG. 4 is a view showing a practical semiconductor device employing a composite insulating layer structure having a plurality of layers.
Figure 5:
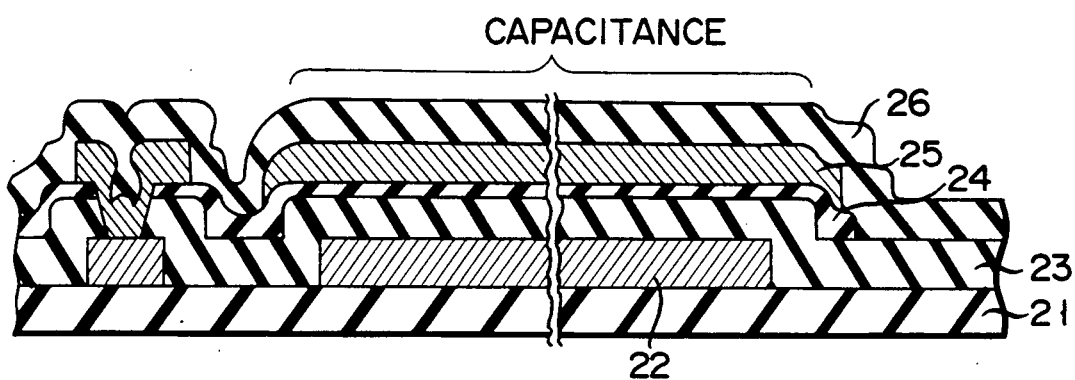
FIG. 5 is a view showing a practical semiconductor device including a capacitive element.
Figure 6:
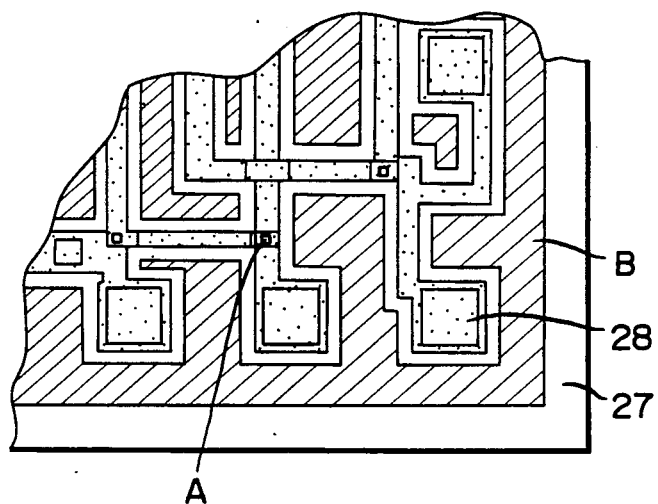
FIG. 6 is a view showing a practical semiconductor device with an eliminated portion of its organic insulating film formed as being broader in area.

FIGS. 4, 5, and 6 show structures having components common to the structures of FIGS. 1A, 1B, and 1C which are identified with like reference numerals. Hence, the description of these common components are not repeated with respect to FIGS. 4, 5, and 6.

As a practical form of semiconductor device, it is rare to use one insulating layer in a composite insulating interlayer overlying a practical semiconductor substrate. A plurality of insulating layers 23' and 24' can be used in the composite insulating interlayer as shown in FIG. 4. In the latter case, the composite insulating interlayer becomes complex and their individual layers become thinner. In this case, the involved film structure is weaker than a simpler layer structure in terms of its strength against thermal stress and, therefore, the present invention be can be effectively applied to this case in particular.

FIG. 5 shows a semiconductor device when a capacitive element is formed on the substrate by using composite insulating interlayers 23 and 24 as a dielectric. With an increasing capacitance area, the corresponding insulating layer structure becomes greater. This leads to enlarge the deviation caused by heat stress in the capacitance construction of the organic and inorganic insulating layer structure, and hence to a greater risk of cracks. The present invention will be proved effective if it is applied to this type of structure.

The aforementioned eliminated portion of the organic insulating film may have a plain-like figure, as shown in FIG. 6, rather than being linear as in the first embodiment of the present invention. Since, according to the present invention, two inorganic insulating films are formed in direct contact with each other at the aforementioned eliminated portion of the organic insulating film, it is possible to enhance a resistance to stress as caused by heat shock and hence to attain an enhanced resistance with the presence of an increasing contact area of the aforementioned inorganic insulating films. In the case of a circuit which is a relatively simple structure and greater in spacing, it is also possible to achieve an enhanced resistance to thermal stress by forming the aforementioned eliminated portion of the organic insulating film.

Figure 7:
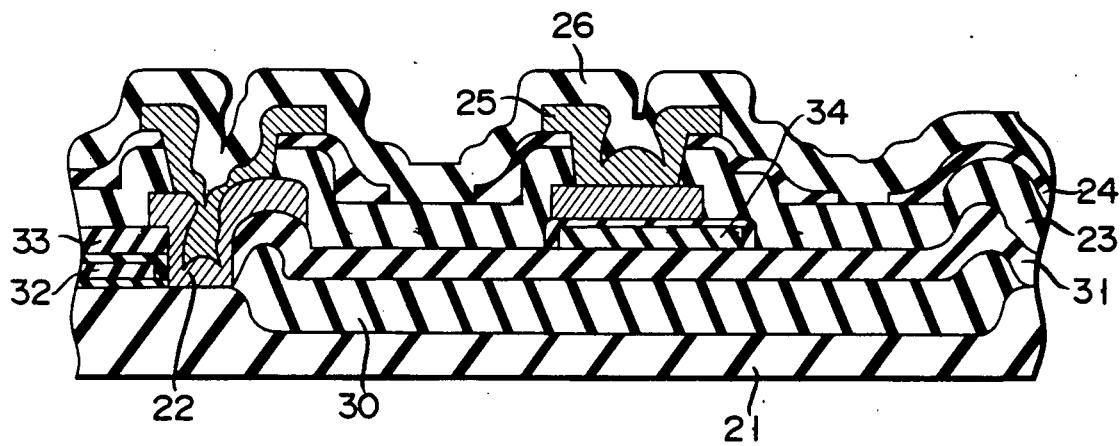
FIG. 7 is a cross-sectional view showing a semiconductor device having an uneven surface according to another embodiment of the present invention.

FIG. 7 shows a portion of a semiconductor device including a multi-layered structure. In the arrangement shown in FIG. 7, first and second interconnection layers are aluminum; first and second insulating films 23 and 26, P-SiN; organic insulating film 24, a polyimide resin; insulating film 30, a thermal $SiO_2$; insulating film 31, a $CVD.SiO_2$; gate electrode 32, a poly-Si; insulating film 33, a $CVD.SiO_2$; and resistive element 34, a poly-Si. In a complex semiconductor device including a multi-layered structure, semiconductor substrate 21 is often formed to have an uneven surface and the resultant structure becomes complex and unstable in terms of its strength. The present invention can also be applied to the semiconductor device including uneven semiconductor substrate 21 so that an added strength may be provided to the insulating layer structure.

As first and second inorganic insulating films 23 and 26, use may be made of an oxide, nitride or carbide in the form of silicon oxide, silicon nitride or silicon carbide. A polyimide resin ma be used for organic insulating film 24 which, together with the inorganic insulating film, forms a composite insulating layer structure.

As set out above, according to the present invention, it is possible to manufacture a semiconductor device of a multi-layered interconnection structure, such as a composite interlayer, in a simpler process and that semiconductor device can prevent the occurrence of cracks as caused by stress upon the application of thermal shock.

What is claimed is:

1. A semiconductor device of multi-layered structure, comprising:
   a plurality of interconnection layers formed on a semi-conductor substrate;
   a composite insulating film structure formed on an insulating film overlying said semiconductor substrate and having a first inorganic insulating film formed over said semiconductor substrate;
   an organic insulating film formed on said first inorganic insulating film and having an eliminated portion and having a portion terminating on a surface of said first inorganic insulating film to form a step structure therewith at a location separated from said interconnection layers, said organic insulating film having protruding portions which are not covered by said interconnection layers; and
   a second inorganic insulating film formed on said organic insulating film and formed directly on said first inorganic insulating film through said eliminated portion.

2. A semiconductor device according to claim 1, wherein two or more of said composite insulating film structures are formed over said semiconductor substrate.

3. A semiconductor device according to claim 1, further including a capacitive element formed over said semiconductor substrate with said composite insulating film structure constituting a dielectric.

4. A semiconductor device according to claim 1, wherein said eliminated portion has a plain-like figure.

5. A semiconductor device according to claim 1, wherein said eliminated portion has a linear-like figure.

6. A semiconductor device according to claim 1, wherein said semiconductor substrate has an uneven surface.

7. A semiconductor device according to claim 1, wherein said first inorganic insulating film is formed of an oxide.

8. A semiconductor device according to claim 1, wherein said first inorganic insulating film is formed of a nitride.

9. A semiconductor device according to claim 1, wherein said first inorganic insulating film is formed of a carbide.

10. A semiconductor device according to claim 1, wherein said organic insulating film is formed of polyimide.

11. A semiconductor device according to claim 1, wherein said second inorganic insulating film is formed of an oxide.

12. A semiconductor device according to claim 1, wherein said second inorganic insulating film is formed of a nitride.

13. A semiconductor device according to claim 1, wherein said second inorganic insulating film is made of a carbide.

14. A semiconductor device according to claim 1, wherein said first and second inorganic insulating films are formed of the same type of material.

15. A semiconductor device according to claim 1, wherein said first and second inorganic insulating films are formed of a different material.

16. A semiconductor device according to claim 7 or 11, wherein said oxide is formed of a silicon oxide.

17. A semiconductor device according to claim 8 or 12, wherein said nitride is formed of a silicon nitride.

18. A semiconductor device according to claim 9 or 13 wherein said carbide is formed of a silcon carbide.

19. A semiconductor device including:
   a composite insulating film structure formed on an insulating film overlaying a semiconductor substrate and having a first inorganic insulating film formed on the semiconductor substrate; and organic insulating film formed on the first inorganic film and having an eliminated portion;
   a second inorganic insulating film formed on the organic insulating film and directly on the first inorganic insulating film at a location of said eliminated portion of said organic insulating film;
   interconnection layers formed on said semiconductor substrate, said interconnection layers covering one portion of said organic insulating film, with said organic insulating film having protruding portions not covered by said interconnection layers and said organic insulating film having a portion terminating on a surface of said first inorganic insulating film to form a step structure therewith at a location separated from said interconnection layers; and
   capacitive element formed with said composite insulating film structure as a dielectric.

* * * * *